(12) United States Patent
Chiou et al.

(10) Patent No.: US 8,828,650 B2
(45) Date of Patent: Sep. 9, 2014

(54) METHOD FOR MAKING A RETARDER

(75) Inventors: Da-Ren Chiou, Taipei (TW); Wei-Che Hung, Taipei (TW); Chiu-Fang Chen, Taipei (TW); Yu-June Wu, Taipei (TW)

(73) Assignee: Far Eastern New Century Corporation, Taipei (TW)

( * ) Notice: Subject to any disclaimer, the term of this patent is extended or adjusted under 35 U.S.C. 154(b) by 70 days.

(21) Appl. No.: 13/618,008

(22) Filed: Sep. 14, 2012

(65) Prior Publication Data

US 2013/0064985 A1    Mar. 14, 2013

Related U.S. Application Data

(63) Continuation-in-part of application No. 13/231,863, filed on Sep. 13, 2011.

(30) Foreign Application Priority Data

Feb. 22, 2012  (TW) .............................. 101105812 A

(51) Int. Cl.
*G03F 7/26* (2006.01)
*C08F 2/46* (2006.01)

(52) U.S. Cl.
CPC ........................................ *C08F 2/46* (2013.01)
USPC ............ 430/319; 430/320; 430/328; 430/394

(58) Field of Classification Search
CPC .................... G02F 1/133555; G02F 1/134363; G02F 1/13363; G02F 1/1393; G02B 5/3083
USPC ................... 430/319, 328, 394, 322
See application file for complete search history.

(56) References Cited

U.S. PATENT DOCUMENTS

| 5,926,241 | A | 7/1999 | Gunning ....................... 349/117 |
| 6,020,107 | A * | 2/2000 | Niiyama et al. .............. 430/296 |
| 6,036,579 | A | 3/2000 | Cook et al. ....................... 451/36 |
| 6,541,182 | B1 * | 4/2003 | Louis Joseph Dogue et al. .............................. 430/296 |
| 2002/0096666 | A1 | 7/2002 | Ichikawa |
| 2007/0020404 | A1 | 1/2007 | Seiberle et al. ................ 428/1.2 |
| 2011/0292329 | A1 * | 12/2011 | Huang et al. ................... 349/117 |

FOREIGN PATENT DOCUMENTS

| EP | 1905792 | 4/2008 |
| JP | 2001-100150 | 4/2001 |
| JP | 2006-243097 | 9/2006 |
| JP | 2006-278362 | 10/2006 |

(Continued)

OTHER PUBLICATIONS

Office Action mailed on Dec. 6, 2012 from related U.S. Appl. No. 13/231,863.
Office Action mailed on Mar. 15, 2013 from related U.S. Appl. No. 13/231,863.
Office Action mailed on Aug. 29, 2013 from related U.S. Appl. No. 13/231,863.

(Continued)

*Primary Examiner* — Caleen Sullivan
(74) *Attorney, Agent, or Firm* — Ladas & Parry, LLP

(57) ABSTRACT

A method for making a retarder includes: (a) forming a photocurable layer on a substrate, the photocurable layer including at least one photocurable prepolymer that has a plurality of reactive functional groups and a functional group equivalent weight ranging from 70 to 700 g/mol; (b) covering partially the photocurable layer using a patterned mask; (c) exposing the photocurable layer through the patterned mask; (d) removing the patterned mask; (e) exposing the photocurable layer to cure second regions of the photocurable layer so as to form a microstructure; (f) forming an alignment layer on the microstructure; (g) forming a liquid crystal layer on the alignment layer; and (h) curing the liquid crystal layer.

16 Claims, 4 Drawing Sheets

(56) References Cited

FOREIGN PATENT DOCUMENTS

| | | | |
|---|---|---|---|
| JP | 2007-012970 | | 1/2007 |
| JP | 2011-032410 | * | 2/2011 |
| KR | 10-0191085 | | 6/2009 |
| TW | I222925 | | 11/2004 |
| WO | 2006/038392 | | 4/2006 |
| WO | 2007/007803 | | 1/2007 |

OTHER PUBLICATIONS

Office action dated Jul. 8, 2013 from corresponding Japanese Patent Application No. 2011-210639 along with its English translation provided by Google Translator Toolkit.

Office action dated Jul. 25, 2013 from corresponding Korean Patent Application No. 10-2011-0114322 with the English summary provided by the applicant.

* cited by examiner

METHOD FOR MAKING A RETARDER

CROSS-REFERENCE TO RELATED APPLICATION

This application claims priority from Taiwanese application no. 101105812, filed on Feb. 22, 2012, and is a continuation-in-part (CIP) of U.S. patent application Ser. No. 13/231,863, filed on Sep. 13, 2011, the disclosures of which are hereby incorporated by reference in their entireties.

BACKGROUND OF THE INVENTION

1. Field of the Invention

This invention relates to a method for making a retarder, more particularly to a method for making a retarder that has at least one thick layer region and at least one thin layer region.

2. Description of the Related Art

A liquid crystal has different refractive indices indifferent axes (i.e., birefringence). In many optical applications, the birefringence of the liquid crystal is commonly utilized for forming a retarder with a desired phase difference value. As such, a backlight module having the retarder can be used to improve a contrast and a viewing angle of a display. Moreover, when a 3D display device includes a display panel attached with a retarder having alternating first and second regions in a plane direction of the retarder to provide a phase difference value, it can provide a 3D image. The 3D display device may be a naked eye type display or an eyeglass type display.

Japanese Patent Publication No. 2001-100150 discloses a mechanical method for forming a retarder. In this publication, after a retarder film is attached to a hard substrate, an undesired portion of the retarder film is cut using a cutter so as to obtain a retarder having two different regions to provide a phase difference of $\lambda/2$. However, the mechanical method is relatively complex, and the cutter is likely to deform after repeating the cutting process, thereby reducing the yield rate of the retarder. Moreover, waste chips produced during the cutting process may also be a factor of the reduced yield rate. Therefore, this method is not suitable for mass production.

In order to settle the above problems, a method for making a retarder, which is disclosed in US patent application publication no. 2007/0020404, has been proposed. In this method, a mixture of a cross-linkable liquid crystal polymer and a non-cross-linkable liquid crystal polymer is applied to an alignment layer formed on a substrate, thereby forming a liquid crystal layer on the alignment layer. Then, the liquid crystal layer is exposed to UV light so as to induce a cross-linking reaction of the cross-linkable liquid crystal polymer. Thereafter, the non-cross-linkable liquid crystal polymer in the liquid crystal layer is removed using a solvent. Accordingly, the liquid crystal layer has a required phase structure, such as a microstructure having indentations or grooves, thus obtaining a phase difference distribution.

However, this method is still complex, and the phase structure formed by the method is less likely to have a regular arranged pattern. Thus, if the retarder is not precisely positioned in a 3D display, double image or the so-called "ghost" may occur.

In addition, U.S. Pat. No. 5,926,241 discloses a method to make retarders. In this method, a liquid crystal layer is formed on a substrate, and heated until the liquid crystal layer exhibits an isotropic phase (at this time, the liquid crystals still have no phase difference). Then, the liquid crystal layer is exposed to UV light through a patterned mask to cure specific regions of the liquid crystal layer. Thereafter, the liquid crystal layer is cooled to room temperature, thereby aligning the liquid crystals in uncured regions of the liquid crystal layer. At this time, the liquid crystal layer has two different regions, exhibits an anisotropic phase, and has a phase difference of $\lambda/2$. Finally, the liquid crystal layer is fully exposed to UV light and fully cured, thereby forming a retarder.

However, at an interface between the two different regions (i.e., the region cured at a relatively high temperature and the region cured at room temperature), the liquid crystals may align in an irregular fashion, resulting in light leakage of a display and poor display quality.

SUMMARY OF THE INVENTION

Therefore, an object of the present invention is to provide a method for making a retarder that can overcome the aforesaid drawbacks associated with the prior art.

Accordingly, a method for making a retarder of this invention comprises:

(a) forming a photocurable layer on a substrate, the photocurable layer including a photocurable compound having at least one photocurable prepolymer that has a plurality of reactive functional groups and a functional group equivalent weight ranging from 70 to 700 g/mol;

(b) covering partially the photocurable layer using a patterned mask;

(c) exposing the photocurable layer through the patterned mask using a first light source so that the photocurable layer is cured at first regions which are exposed;

(d) removing the patterned mask;

(e) exposing the photocurable layer using a second light source to cure second regions of the photocurable layer which have not been cured, the first and second regions having different surface heights so as to form a microstructure on the substrate;

(f) forming an alignment layer on the microstructure;

(g) forming a liquid crystal layer on the alignment layer so that the liquid crystal layer is aligned by the alignment layer; and (h) curing the liquid crystal layer so that the liquid crystal layer includes at least one thick layer region and at least one thin layer region.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 8:
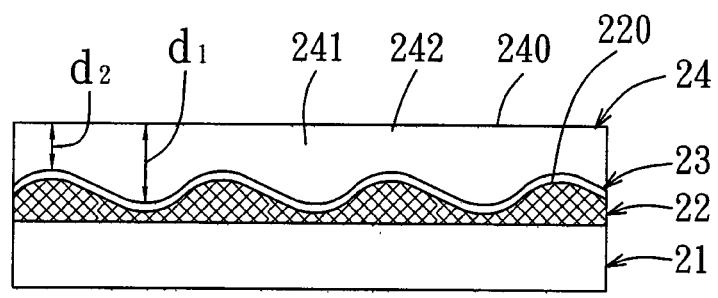

Referring to FIG. 8, a retarder made by a method according to the preferred embodiment of this invention comprises a substrate 21, a microstructure 22, an alignment layer 23, and a cured liquid crystal layer 24. The microstructure 22 is formed on the substrate 21 and has an upper surface 220 formed with a plurality of alternating ridge and valley portions. The alignment layer 23 is formed on the microstructure 22 and extends along the upper surface 220 of the microstructure 22 to have substantially the same surface topography as the microstructure 22. The cured liquid crystal layer 24 is formed on the alignment layer 23, and has a flat upper surface 240 opposite to the alignment layer 23. As such, the cured liquid crystal layer 24 has alternating thick layer regions 241 and thin layer regions 242 in a plane direction of the retarder to provide a phase difference value. Such retarder can be used in a naked eye type 3D display or an eyeglass type 3D display to provide a 3D image.

Figure 6:
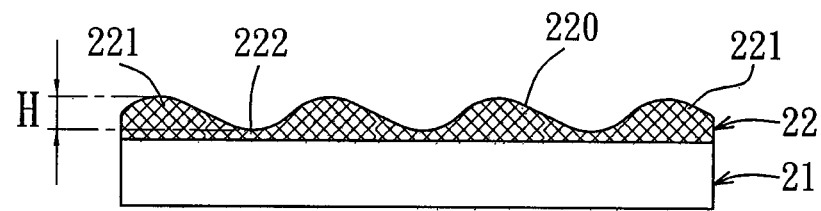

Preferably, the microstructure 22 has a Rz value ranging from 1.05 μm to 3.56 μm in order to form a retarder used in a 3D display to provide a 3D effect. The Rz value is determined by a ten-point average value of surface height differences (H) (see FIG. 6) among two adjacent ones of the ridge and valley portions of the microstructure 22. In this embodiment, the Rz value was measured using a probing surface roughness meter (available from KOSAKA Laboratory Ltd., Japan, Model No. ET4000A).

Each of the thick layer regions 241 and the thin layer regions 242 is strip-shaped. The thick layer regions 241 have a maximum thickness $d_1$, and the thin layer regions 242 have a maximum thickness $d_2$ (see FIG. 8). A maximum thickness difference $(d_1-d_2)$ between the thick layer regions 241 and the thin layer regions 242 ranges preferably from 1 μm to 3 μm. Preferably, the cured liquid crystal layer 24 has two refractive indices, and a refractive index difference (i.e., birefringence) between the two refractive indices ranges from 0.1 to 0.3, in order to form a retarder of a 3D display using a liquid crystal material that is commonly used or readily available in the art.

The 3D display quality is greatly influenced by a phase difference value (i.e., a value obtained by multiplying the thickness of the cured liquid crystal layer by the birefringence of the same). Therefore, the phase difference value between the thick layer regions 241 and the thin layer regions 242 is at least greater than 200 nm, and preferably greater than 260 nm, in order to gain good 3D display quality.

Alternatively, a retarder may also be applied as, for example, a compensator.

In the following, referring to FIG. 1, methods for making a retarder according to the preferred embodiment of this invention are described.

Figure 1:
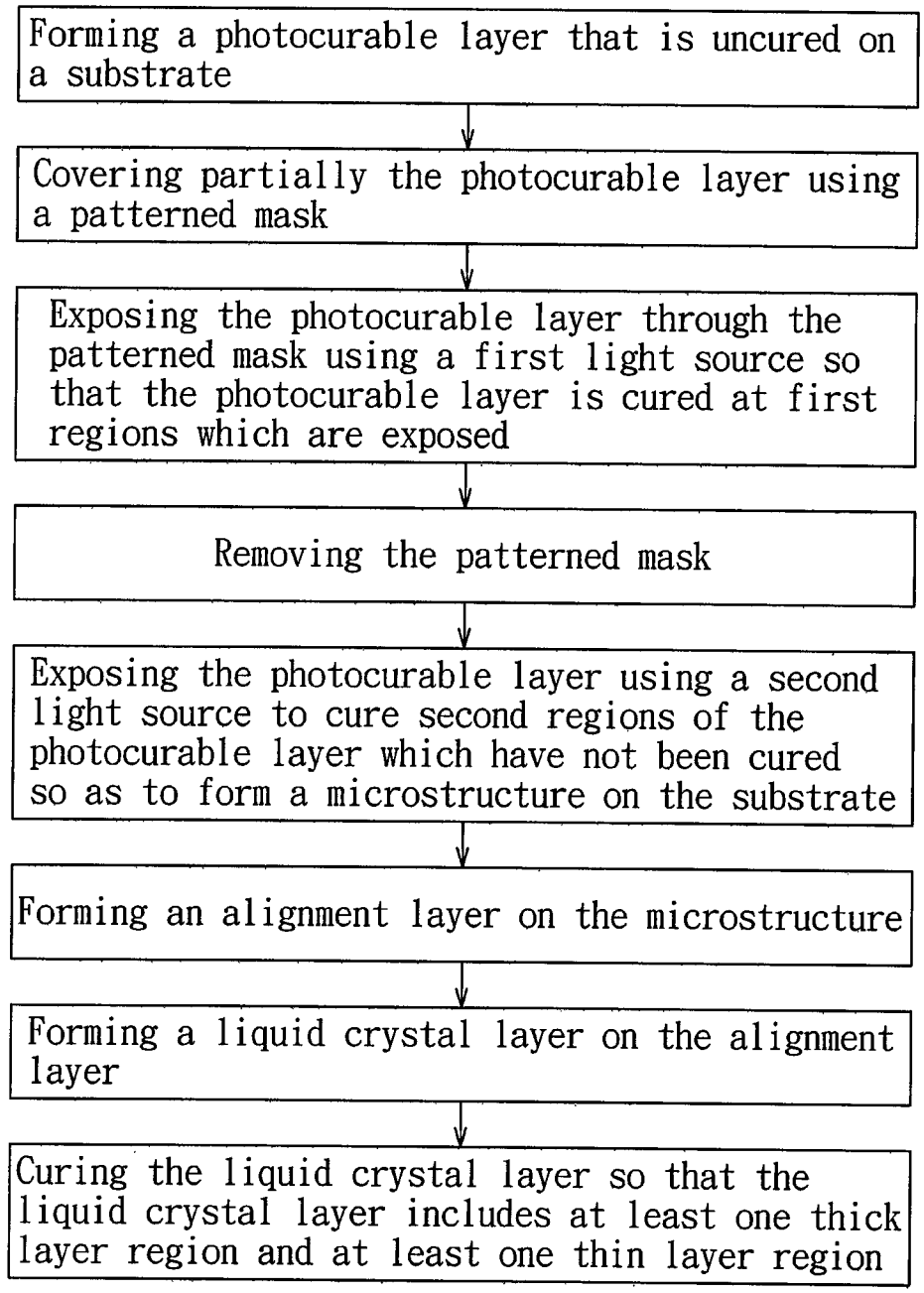
FIG. 1 is a flow chart illustrating a method for making a retarder according to the preferred embodiment of the present invention.

As illustrated in FIG. 1, the preferred embodiment of a method for making a retarder of this invention comprises the following steps (a) to (h) in sequence.

Figure 2:
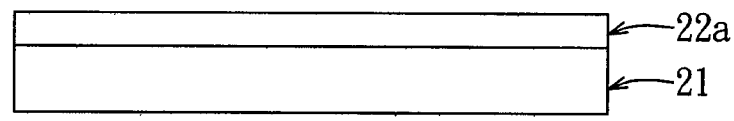
FIGS. 2 to 8 are schematic side views illustrating consecutive steps of a method for making a retarder according to the preferred embodiment of the present invention.

In step (a), a substrate 21 is coated with a paste including a solvent, a photocurable compound that has at least one photocurable prepolymer (monomer or oligomer), and a photoinitiator. The photocurable prepolymer has a plurality of reactive functional groups, and a functional group equivalent weight ranging from 70 to 700 g/mol. Then, the paste is dried to remove the solvent from the paste and to form a photocurable layer 22a that is uncured on the substrate 21 (see FIG. 2).

Figure 3:
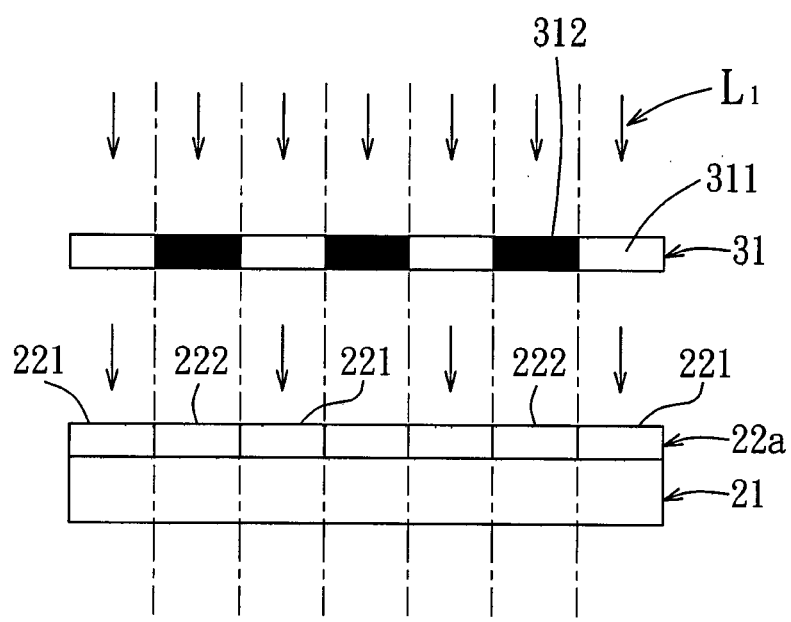

In step (b), the photocurable layer 22a is partially covered using a patterned mask 31 (see FIG. 3).

In step (c), the photocurable layer 22a is exposed to a first light source L1 so that the photocurable prepolymer in the photocurable layer 22a is cured at first regions 221 which are exposed from the patterned mask. The photocurable compound flows from second regions 222 that have not been cured toward the first regions 221 in which a curing process is proceeding, so that a thickness of the first regions 221 increase while a thickness of the second regions 222 decrease. (see FIGS. 3 and 4). In this embodiment, the first and second regions 221, 222 are arranged alternately.

In step (d), the patterned mask 31 is removed.

Figure 5:
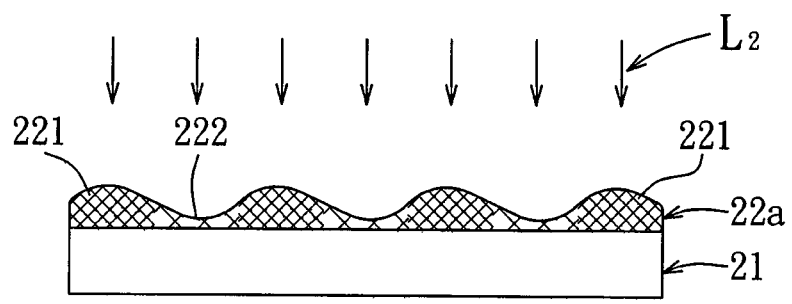

In step (e), the photocurable layer 22a is exposed to a second light source L2 to cure the second regions 222 which have not been cured in step (c) and which are concave. Accordingly, the photocurable layer 22a is formed into a microstructure 22, in which the first and second regions 221, 222 of the photocurable layer 22a have different surface heights so as to provide a surface roughness (Rz) (see FIGS. 5 and 6).

Figure 7:
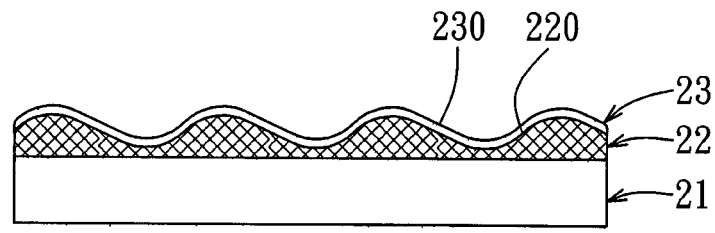

In step (f), an alignment layer 23 is formed on the microstructure 22. The alignment layer 23 has an alignment surface 230 that is opposite to an upper surface 220 of the microstructure 22 and that has a surface roughness substantially the same as that of the microstructure 22 (see FIG. 7).

In step (g), the alignment surface 230 is coated with liquid crystals to form a liquid crystal layer 24 having a flat upper surface 240 opposite to the alignment layer 23. As such, the liquid crystal layer 24 is aligned by the alignment layer 23 (see FIG. 8).

In step (h), the liquid crystal layer 24 is cured using a light-exposing process. The cured liquid crystal layer 24 includes thick layer regions 241 and thin layer regions 242 (see FIG. 8).

In this embodiment, the reactive functional group equivalent weight of the photocurable prepolymer is defined by the molecular weight of the photocurable prepolymer divided by the number of the reactive functional groups.

The reactive functional group equivalent weight of the photocurable prepolymer ranges preferably from 70 to 700 g/mol, more preferably from 80 to 600 g/mol, and most preferably from 85 to 400 g/mol.

In the following, a curing mechanism of the photocurable prepolymer to form the microstructure 220 is described.

The photocurable layer 22a is formed by coating the substrate 21 with the paste that includes the solvent and the photocurable compound having at least one of the aforesaid photocurable prepolymers and the photoinitiator. When the first regions 221 of the photocurable layer 22a are exposed to the first light source L1 through the patterned mask 31, the photoinitiator generates free radicals. The free radicals initiate the cross-linking reaction of the photocurable prepolymer at the first regions 221 of the photocurable layer 22a.

Figure 4:
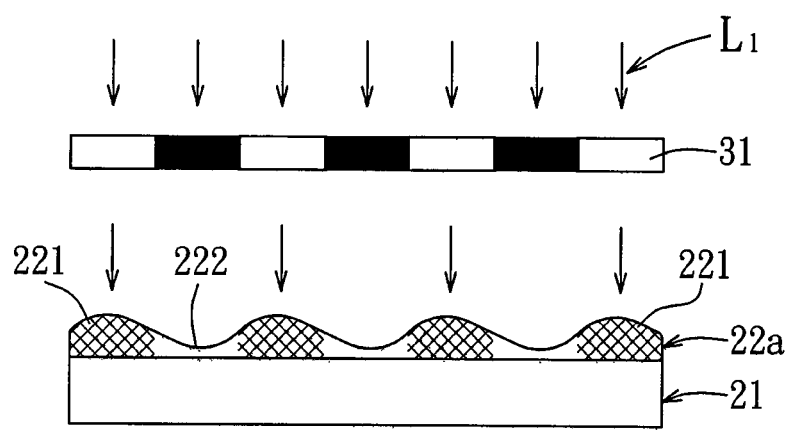

With the progress of the cross-linking reaction in the first regions 221 of the uncured photocurable layer 22a, the average molecular weight of the molecules and the viscosity increase in the first regions 221, and the concentration of unreacted photocurable compound is also gradually reduced. In this case, the unreacted photocurable compound in the second regions 222 of the photocurable layer 22a has a relatively high concentration. Since a material tends to diffuse from the zone of high concentration toward that of low concentration, the unreacted photocurable compound in the second regions 222 flows toward the first regions 221. The cross-linking reaction is terminated when the viscosity reaches a limit value. Accordingly, as shown in FIG. 4, after the step (c), the cured portion of the photocurable layer 22a protrudes in the first regions 221, and the non-cured portion of the photocurable layer 22a is indented in the second regions 222, thereby forming the microstructure 22 with alternating ridge and valley portions.

The smaller the molecular weight of the photocurable compound, the faster the unreacted photocurable compound in the second regions 222 flows toward the first regions 221. In the case of using the photocurable compound with a smaller molecular weight, an average difference value between the surface heights of the first and second regions 221, 222 (i.e., a surface roughness (Rz) of the microstructure 220) becomes larger.

Similarly, the larger the number of the reactive functional groups of the photocurable compound, the more active will be the curing of the photocurable layer 22a. In other words, the smaller the reactive functional group equivalent weight of the photocurable compound, the more active will be the curing of the photocurable layer 22a. In the case of using the photocurable compound with a larger number of the reactive functional groups, the unreacted photocurable compound in the second regions 222 flows toward the first regions 221 faster, and the average difference value between the surface heights of the first and second regions 221, 222 (i.e., the surface roughness (Rz) of the microstructure 22) becomes larger.

It should be noted that, in step (c) and step (e), the photocurable layer 22a may be fully cured or partially cured. As long as the photocurable compound at the first and second regions 221, 222 is no longer flowable, the curing degree of the photocurable compound should not be limited.

The patterned mask 31 has alternating light-transmissive regions 311 and light impermeable regions 312. The light-transmissive regions 311 are strip-shaped and used for passage of light from the first light source L1, and the light impermeable regions 312 are strip-shaped and used for blocking, absorbing, or reflecting light from the first light source L1.

The reactive functional groups of the photocurable prepolymer should not be limited so long as they are photopolymerizable. Non-limiting examples of the reactive functional groups include an alkenyl group, an epoxy group, etc. When the alkenyl groups are included, non-limiting examples of the photocurable prepolymer include an acrylic-based compound, an ether-based compound including a vinyl group, a styrene-based compound, a thiolene-based compound, etc.

The solvent used in step (a) may be any one that can sufficiently dissolve the photocurable compound and the photoinitiator, and may be selected from alcohols, ketones, esters, halogenated solvents, hydrocarbons, etc. Examples of the solvent include acetone, acetonitrile, chloroform, chlorophenol, cyclohexane, cyclohexanone, cyclopentanone, dichloromethane, diethyl acetate, dimethyl carbonate, ethanol, ethyl acetate, N,N-dimethyl acetamide, 1,2-propanediol, 2-hexanone, methanol, methyl acetate, butyl acetate, toluene, tetrahydrofuran, and combinations thereof.

The photoinitiator used in the paste can be any one that may facilitate photocurability of the photocurable compound, and may be selected from the group consisting of vinyl phenone derivatives, benzophenone derivatives, Michler's ketone, benzyne, benzyl derivatives, benzoin derivatives, benzoin methyl ether derivatives, α-acyloxy ester, thioxanthone derivatives, and anthraquinone derivatives. The amount of the photoinitiator used in the paste is not limited, and is preferably not less than 0.01 wt % based on a total weight of the paste.

Preferably, the substrate 21 is made of transparent insulating material such as polymer. The polymer is selected from the group consisting of polyester-based resin, acetate-based resin, polyether-based resin, polycarbonate-based resin, polyamide-based resin, polyimide-based resin, polyolefin-based resin, acrylic-based resin, polyvinyl chloride-based resin, polystyrene-based resin, polyvinyl alcohol-based resin, polyarylate-based resin, polyphenylene sulfide-based resin, polyvinylidene chloride-based resin, methylacrylic-based resin, and combinations thereof. More preferably, the substrate 21 is made of triacetyl cellulose.

Preferably, the first light source L1 is UV light, visible light, an electron beam, or an X-ray, and the UV light is more preferable. In step (c), the exposure dosage of the first light source L1 is preferably not less than 70 mJ/cm$^2$, and more preferably ranges from 70 mJ/cm$^2$ to 4000 mJ/cm$^2$. If the exposure dosage is less than 70 mJ/cm$^2$, the microstructure 22 may not be formed. If the exposure dosage is more than 4000 mJ/cm$^2$, the substrate 21 may be deformed. Therefore, the exposure dosage of the first light source L1 is more preferably from 100 mJ/cm$^2$ to 3500 mJ/cm$^2$, and most preferably from 400 mJ/cm$^2$ to 1500 mJ/cm$^2$.

Preferably, the second light source L2 may also be UV light, visible light, electron beam, or X-ray, and the UV light is more preferable. The exposure dosage of the second light source L2 is not limited as long as the photocurable layer 22a (especially the second regions 222) can be fully cured. Besides, the first and second light sources L1, L2 may be the same or different.

In step (f), the alignment layer 23 can be formed using a photo alignment method or a rubbing alignment method, and is used for aligning liquid crystal molecules in the liquid crystal layer 24 in step (g).

In the photo alignment method, the alignment layer 23 is formed by coating a photo-induced alignment resin to obtain a resin layer on the microstructure 22, drying the resin layer, followed by exposing and curing the resin layer using linearly-polarized UV light.

In the rubbing alignment method, the alignment layer 23 is formed by coating a rubbed alignment resin to form a resin layer on the microstructure 22, drying the resin layer, followed by performing a rubbing treatment on the resin layer such that the resin layer is formed with rubbed grooves extending in a predetermined direction.

The rubbed alignment resin is preferably selected from the group consisting of polyimide-based resin and polyvinyl alcohol-based resin.

The photo-induced alignment resin is preferably selected from the group consisting of a photo-isomerization compound, a photo-crosslinking compound, and a photo-decomposition compound.

Preferably, the photo-isomerization compound is an azo dye compound.

Preferably, the photo-crosslinking compound is selected from the group consisting of cinnamate derivatives, chalcone derivatives, maleimide derivatives, quinolinone derivatives, diphenylmethylene derivatives, coumarin derivatives and combinations thereof.

Preferably, the photo-decomposition compound is selected from the group consisting of polyimide, polyamide, polyester, polyurethane, and combinations thereof.

The present invention will now be explained in more detail below by way of the following examples. It should be noted that the examples are only for illustration and not for limiting the scope of the present invention.

<Forming a Microstructure>

Hereinafter, the microstructures of Examples 1~9 were prepared as follows.

Example 1

0.4 g of an uncured photocurable material having a photo-reactive functional group (available from KYOEISHA, trade name: LIGHT ACRYLATE PE-4A, acryl-based resin having a functional group equivalent weight of 88 g/mol) was mixed with 0.6 g of toluene and 0.02 g of a photoinitiator (available from Ciba, trade name: I-184) to obtain a paste (1.02 g) having a solid content of 40 wt %.

The paste was dropped on an acetate-based substrate (available from Konica Minolta, TAC, 5 cm×5 cm×80 μm), and was evenly spin coated on the substrate at a speed of 500 rpm for 40 seconds. Then, the substrate coated with the paste was disposed in an oven maintained at 80° C. for 3 minutes to remove the solvent (i.e., toluene), and subsequently moved to another oven maintained at 100° C. to heat for 2 minutes, followed by cooling to room temperature to form the photocurable layer of 4.65 μm thickness on the substrate (See FIG. 2).

A patterned mask having a line spacing of 110 μm and a line width of 110 μm was disposed on the photocurable layer. The photocurable layer was exposed to a first UV light source (the first light source L1) of an UV exposure machine (available from US Fusion) at an exposure dosage of 650 mJ/cm$^2$ in a nitrogen atmosphere (See FIGS. 3 and 4). Thereafter, exposed first regions of the photocurable layer were formed into cured ridge portions, and unexposed second regions were formed into uncured valley portions. After the patterned mask was removed, the photocurable layer was further exposed to a second UV light source (the second light source L2) at an exposure dosage of 450 mJ/cm$^2$ in a nitrogen atmosphere (See FIG. 5). All of the first and second regions were cured to have different surface heights and to obtain the microstructure having a surface roughness of 3.56 μm Rz value.

Examples 2~6

In Examples 2~6, the microstructures were formed based on the procedure employed in Example 1 except that the photocurable materials and the thickness of the photocurable layers are different. Besides, in Example 6, the solvent is different from Examples 1~5. Each of the forming conditions and the surface roughness in Examples 1~6 are listed in Table 1. The photocurable materials for forming the photocurable layers of Examples 2~6 are listed as follows.

Example 2

Available from Cognis, trade name: 4600, acryl-based resin having a functional group equivalent weight of 96.3 g/mol Example 3

Available from Sartomer, trade name: SR444, acryl-based resin having a functional group equivalent weight of 99.3 g/mol Example 4

Available from Cognis, trade name: 4172F, acryl-based resin having a functional group equivalent weight of 132 g/mol Example 5

Available from Sartomer, trade name: CN-9006, acryl-based resin having a functional group equivalent weight of 400 g/mol Example 6

Available from Double Bond Chemical, trade name: 176, acryl-based resin having a functional group equivalent weight of 750 g/mol

TABLE 1

|  | Ex. 1 | Ex. 2 | Ex. 3 |
|---|---|---|---|
| Photocurable material | PE-4A 0.4 g | 4600 0.4 g | SR444 0.4 g |
| Solvent | toluene 0.6 g | toluene 0.6 g | toluene 0.6 g |
| Photoinitiator (I-184) | 0.02 g | 0.02 g | 0.02 g |
| Functional group equivalent weight of the photocurable material (g/mol) | 88 | 96.3 | 99.3 |
| The thickness of the photocurable layer before curing (μm) | 4.65 | 4.62 | 3.63 |
| Drying temperature | (1) 80° C. 3 min. (2) 100° C. 2 min. | (1) 80° C. 3 min. (2) 100° C. 2 min. | (1) 80° C. 3 min. (2) 100° C. 2 min. |
| Exposure dosage (mJ/cm$^2$) | (1) 650 (2) 450 | (1) 650 (2) 450 | (1) 650 (2) 450 |
| Mask pattern | line spacing: 110 μm line width: 110 μm | line spacing: 110 μm line width: 110 μm | line spacing: 110 μm line width: 110 μm |
| Surface roughness (Rz value) | 3.56 μm | 2.74 μm | 2.01 μm |

|  | Ex. 4 | Ex. 5 | Ex. 6 |
|---|---|---|---|
| Photocurable material | 4172F 0.4 g | CN-9006 0.4 g | 176 0.4 g |
| Solvent | toluene 0.6 g | toluene 0.6 g | cyclohexanone 0.6 g |
| Photoinitiator (I-184) | 0.02 g | 0.02 g | 0.02 g |
| Functional group equivalent weight of the photocurable material (g/mol) | 132 | 400 | 750 |
| The thickness of the photocurable layer before curing (μm) | 10.31 | 17.63 | 4.61 |
| Drying temperature | (1) 80° C. 3 min. (2) 100° C. 2 min. | (1) 80° C. 3 min. (2) 100° C. 2 min. | (1) 80° C. 3 min. (2) 100° C. 2 min. |
| Exposure dosage (mJ/cm$^2$) | (1) 650 (2) 450 | (1) 650 (2) 450 | (1) 650 (2) 450 |
| Mask pattern | line spacing: 110 μm line width: 110 μm | line spacing: 110 μm line width: 110 μm | line spacing: 110 μm line width: 110 μm |
| Surface roughness (Rz value) | 1.06 μm | 1.05 μm | <0.05 μm |

According to the results of Examples 1~6 shown in Table 1, the larger the functional group equivalent weight of the photocurable material, the smaller will be the surface roughness (Rz) of the microstructure. It is noted that, when the functional group equivalent weight of the photocurable material reached 750 g/mol (see Example 6), the Rz value of the microstructure is greatly reduced to be less than 0.05 μm.

Examples 7~9

In Examples 7~9, the microstructures were formed based on the procedure employed in Example 1 except that the exposure dosages of the first UV light source (the first light source L1) are different. The forming conditions and the surface roughness of the microstructures in Examples 7~9 are listed in Table 2.

TABLE 2

|  | Ex. 1 | Ex. 7 | Ex. 8 | Ex. 9 |
|---|---|---|---|---|
| Photocurable material | PE-4A 0.4 g | PE-4A 0.4 g | PE-4A 0.4 g | PE-4A 0.4 g |
| Solvent | toluene 0.6 g | toluene 0.6 g | toluene 0.6 g | toluene 0.6 g |
| Photoinitiator (I-184) | 0.02 g | 0.02 g | 0.02 g | 0.02 g |
| Functional group equivalent weight of the photocurable material (g/mol) | 88 | 88 | 88 | 88 |
| The thickness of the photocurable layer before curing (μm) | 4.65 | 4.63 | 4.62 | 4.67 |
| Drying temperature | (1) 80° C. 3 min. (2) 100° C. 2 min. | (1) 80° C. 3 min. (2) 100° C. 2 min. | (1) 80° C. 3 min. (2) 100° C. 2 min. | (1) 80° C. 3 min. (2) 100° C. 2 min. |
| Exposure dosage (mJ/cm$^2$) | (1) 650 (2) 450 | (1) 350 (2) 450 | (1) 100 (2) 450 | (1) 50 (2) 450 |
| Mask pattern | line spacing: 110 μm line width: 110 μm | line spacing: 110 μm line width: 110 μm | line spacing: 110 μm line width: 110 μm | line spacing: 110 μm line width: 110 μm |
| Surface roughness (Rz value) | 3.56 μm | 2.88 μm | 1.17 μm | <0.05 μm |

According to the results of Examples 7~9 shown in Table 2, the smaller the exposure dosage of the first UV light source (the first light source L1), the smaller will be the surface roughness (Rz) of the microstructure. It is noted that, when the exposure dosage of the first UV light source is reduced to 50 mJ/cm$^2$, the Rz value of the microstructure is greatly reduced to be less than 0.05 μm.

<Forming a Retarder>

Hereinafter, retarders of Examples 10~15 and Comparative Examples 1~2 were prepared as follows.

Example 10

Methylethylketone and cyclopentanone were mixed in a weight ratio of 1:1 to obtain a mixed solvent (3.5 g). Then, 0.5 g of a photo-induced alignment resin (available from Rolic, trade name: ROP103, cinnamate-based resin, solid content of 10 wt %) was added into the mixed solvent, so that the photo-induced alignment resin was diluted to have a solid content of 1.25 wt %.

The diluted photo-induced alignment resin was spin coated on the microstructure of the substrate of Example 5 at 3000 rpm for 40 seconds. Then, the substrate coated with the photo-induced alignment resin was disposed in an oven maintained at 100° C. for 2 minutes to remove the solvent, followed by cooling to room temperature to obtain a resin layer. Thereafter, the resin layer was exposed to linearly-polarized UV light at an exposure dosage of 20 mJ/cm$^2$ such that the resin layer was cured, and formed into an alignment layer that is capable of aligning liquid crystal molecules (See FIG. 7). In this Example, the alignment layer had a thickness of 50 nm.

Subsequently, 1 g of solid liquid crystal (birefringence: 0.26) was added into 4 g of cyclopentanone to obtain a liquid crystal solution having a solid content of 20 wt %. The liquid crystal solution was spin coated on the alignment layer at 3000 rpm for 40 seconds. Then, the substrate was disposed in an oven maintained at 60° C. for 5 minutes to remove the solvent, followed by cooling to room temperature so as to form a liquid crystal layer on the alignment layer. The liquid crystal layer had a flat upper surface opposite to the microstructure of the substrate and was exposed to UV light at an exposure dosage of 120 mJ/cm$^2$ in a nitrogen atmosphere, thereby curing the liquid crystal layer. Accordingly, a retarder was obtained. The liquid crystal layer had thick layer regions and thin layer regions, since it had the flat upper surface and a lower topography formed according to the microstructure. A maximum thickness $(d_1)$ of the liquid crystal layer was 2.24 μm, and a maximum thickness difference $(d_1-d_2)$ was 1.04 μm (See FIG. 8).

The phase difference of the retarder was measured using a birefringence analyzer (available from Oji Scientific Instruments, Model No. KOBRA-CCD). In Example 10, the phase difference value was 271 nm.

Example 11

In Example 11, a retarder was formed based on the procedure employed in Example 10 except that, in this example, the diluted photo-induced alignment resin was spin coated on the microstructure of the substrate of Example 3, and the solid liquid crystal had birefringence of 0.103. The phase difference value of the retarder obtained in Example 11 was 213 nm.

Example 12

PVA pellets (polymerization degree: 2600; saponification degree: 98 mol %) were added into water at 80~95 degrees Celsius to obtain a PVA solution. Thereafter, methanol was added until a ratio of methanol to the water in the PVA solution became 1:5. At this moment, the PVA solution had a solid content of 8~10 wt %. The PVA solution was spin coated on the microstructure of the substrate of Example 5 at 3000 rpm for 40 seconds. Then, the substrate coated with the PVA solution was disposed in an oven maintained at 100° C. for 2 minutes to remove the solvent, followed by cooling to room temperature to obtain a PVA resin layer. Thereafter, the PVA resin layer was rubbed using the rubbing alignment method such that a PVA alignment layer capable of aligning liquid crystal molecules was formed.

Subsequently, 1 g of solid liquid crystal (birefringence: 0.26) was added into 4 g of cyclopentanone to obtain a liquid crystal solution having a solid content of 20 wt %. The liquid crystal solution was spin coated on the PVA alignment layer at 3000 rpm for 40 seconds. Then, the substrate was disposed in an oven maintained at 60° C. for 5 minutes to remove the solvent (i.e., cyclopentanone), followed by cooling to room temperature so as to form a liquid crystal layer on the PVA alignment layer. The liquid crystal layer had a flat upper surface opposite to the microstructure of the substrate and was exposed to UV light at an exposure dosage of 120 mJ/cm$^2$ in a nitrogen atmosphere, thereby curing the liquid crystal layer. Accordingly, a retarder was obtained. The phase difference value of the retarder obtained in Example 12 was 272 nm.

Example 13

In Example 13, a retarder was formed based on the procedure employed in Example 12 except that, in this example, the PVA solution was spin coated on the microstructure of the substrate of Example 3. The phase difference value of the retarder obtained in Example 13 was 210 nm.

Example 14

In Example 14, a retarder was formed based on the procedure employed in Example 10 except that, in this example, the diluted photo-induced alignment resin was spin coated on the microstructure of the substrate of Example 6. The phase difference value of the retarder obtained in Example 14 was 12 nm.

Example 15

In Example 15, a retarder was formed based on the procedure employed in Example 12 except that, in this example, the PVA solution was spin coated on the microstructure of the substrate of Example 6. The phase difference value of the retarder obtained in Example 15 was 11 nm.

Comparative Example 1

In Comparative Example 1, a retarder was formed based on the procedure employed in Example 10 except that the microstructure used in Comparative Example 1 was prepared according to the method disclosed in PCT Patent Publication No. WO2004/077134. Specifically, the process for forming the microstructure of Comparative Example 1 includes: (1) embossing a thermoset precursor layer coated on a conductive substrate using a male mold formed with embossed patterns; (2) curing the thermoset precursor layer using UV light to obtain a microstructure on the conductive substrate; and (3) removing the conductive substrate formed with the microstructure from the male mold after the thermoset precursor layer is cured.

Thereafter, similar to Example 10, methylethylketone and cyclopentanone were mixed in a weight ratio of 1:1 to obtain a mixed solvent (3.5 g). Then, 0.5 g of a photo-induced alignment resin (available from Rolic, trade name: ROP103, cinnamate-based resin, solid content of 10 wt %) was added into the mixed solvent, so that the photo-induced alignment resin was diluted to have a solid content of 1.25 wt %.

The diluted photo-induced alignment resin was spin coated on the microstructure of the substrate of Comparative Example 1 at 3000 rpm for 40 seconds. Then, the substrate coated with the photo-induced alignment resin was disposed in an oven maintained at 100° C. for 2 minutes to remove the solvent, followed by cooling to room temperature to obtain a resin layer. Thereafter, the resin layer was exposed to linearly-polarized UV light at an exposure dosage of 20 mJ/cm$^2$ such that the resin layer was cured and formed into an alignment layer.

Subsequently, 1 g of solid liquid crystal (birefringence: 0.26) was added into 4 g of cyclopentanone to obtain a liquid crystal solution having a solid content of 20 wt %. The liquid crystal solution was spin coated on the alignment layer at 3000 rpm for 40 seconds. Then, the substrate was disposed in an oven maintained at 60° C. for 5 minutes to remove the solvent, followed by cooling to room temperature so as to form a liquid crystal layer on the alignment layer. The liquid crystal layer had a flat upper surface opposite to the microstructure of the substrate and was exposed to UV light at an exposure dosage of 120 mJ/cm$^2$ in a nitrogen atmosphere, thereby curing the liquid crystal layer. Accordingly, a retarder of Comparative Example 1 was obtained.

However, the phase difference value of the retarder obtained in Comparative Example 1 was too small and could not be measured by the birefringence analyzer. That is to say, the alignment layer of Comparative Example 1 was not capable of aligning the liquid crystal molecules in the liquid crystal layer.

Comparative Example 2

In Comparative Example 2, a retarder was formed based on the procedure employed in Example 12 except that the microstructure used in Comparative Example 2 was the same as that used in Comparative Example 1.

Similar to Comparative Example 1, the phase difference value of the retarder obtained in Comparative Example 2 was too small and could not be measured by the birefringence analyzer. Therefore, the alignment layer of Comparative Example 2 was not capable of aligning the liquid crystal molecules in the liquid crystal layer.

In each of the Comparative Examples, the microstructure may be damaged or be attached with particles during removal from the male mold. Thus, the alignment layer formed using the photo alignment method or the rubbing alignment method fails to align the liquid crystal molecules in the liquid crystal layer.

In the retarder of this invention, because the microstructure has alternating ridge and valley portions in a regular fashion, and because the alignment layer has a surface topography substantially the same as the microstructure, the liquid crystal molecules in the liquid crystal layer may be effectively aligned by the alignment layer to have a phase difference value, thereby providing a retarder with relatively high quality.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A method for making a retarder, comprising:
 (a) forming a photocurable layer on a substrate, the photocurable layer including a photocurable compound having at least one photo curable prepolymer that has a plurality of reactive functional groups and a functional group equivalent weight ranging from 70 to 700 g/mol;
 (b) covering partially the photocurable layer using a patterned mask;
 (c) exposing the photo curable layer through the patterned mask using a first light source so that the photocurable layer is cured at first regions which are exposed;
 (d) removing the patterned mask;

(e) exposing the photocurable layer using a second light source to cure second regions of the photocurable layer which have not been cured so as to form a microstructure on the substrate;

(f) forming an alignment layer on the microstructure;

(g) forming a liquid crystal layer on the alignment layer so that the liquid crystal layer is aligned by the alignment layer; and (h) curing the liquid crystal layer so that the liquid crystal layer includes at least one thick layer region and at least one thin layer region;

wherein after step (h), the cured liquid crystal layer has two refractive indexes, and a refractive index difference between the two refractive indexes ranges from 0.1 to 0.3.

2. The method of claim 1, wherein said reactive functional groups are selected from an alkenyl group and an epoxy group.

3. The method of claim 1, wherein each of the first light source and the second light source is UV light, visible light, electron beam, or X-ray.

4. The method of claim 1, wherein the first light source is UV light and has an exposure dosage of not less than 70 $mJ/cm^2$ and not more than 4000 $mJ/cm^2$.

5. The method of claim 1, wherein the microstructure has a Rz value ranging from 1.05 μm to 3.56 μm.

6. The method of claim 1, wherein a maximum thickness difference between the thick layer region and the thin layer region ranges from 1 μm to 3 μm.

7. The method of claim 1, wherein the alignment layer is made of rubbed alignment resin selected from the group consisting of polyimide-based resin and polyvinyl alcohol-based resin.

8. The method of claim 1, where in the substrate is made of a polymer selected from the group consisting of polyester-based resin, acetate-based resin, polyether-based resin, polycarbonate-based resin, polyamide-based resin, polyimide-based resin, polyolefin-based resin, acrylic-based resin, polyvinyl chloride-based resin, polystyrene-based resin, polyvinyl alcohol-based resin, polyarylate-based resin, polyphenylene sulfide-based resin, polyvinylidene chloride-based resin, methacrylate-based resin, and combinations thereof.

9. The method of claim 1, wherein the substrate is made of triacetyl cellulose.

10. A method for making a retarder, comprising:

(a) forming a photocurable layer on a substrate, the photocurable layer including a photocurable compound having at least one photocurable prepolymer that has a plurality of reactive functional groups and a functional group equivalent weight ranging from 70 to 700 g/mol;

(b) covering partially the photocurable layer using a patterned mask;

(c) exposing the photocurable layer through the patterned mask using a first light source so that the photocurable layer is cured at first regions which are exposed;

(d) removing the patterned mask;

(e) exposing the photocurable layer using a second light source to cure second regions of the photocurable layer which have not been cured so as to form a microstructure on the substrate;

(f) forming an alignment layer on the microstructure;

(g) forming a liquid crystal layer on the alignment layer so that the liquid crystal layer is aligned by the alignment layer; and (h) curing the liquid crystal layer so that the liquid crystal layer includes at least one thick layer region and at least one thin layer region;

wherein the alignment layer is made of a photo-induced alignment resin selected from the group consisting of a photo-isomerization compound, a photo-crosslinking compound, and a photo-decomposition compound.

11. The method of claim 10, wherein the photo-isomerization compound is an azo dye compound.

12. The method of claim 10, wherein the photo-crosslinking compound is selected from the group consisting of cinnamate derivatives, chalcone derivatives, maleimide derivatives, quinolinone derivatives, diphenylmethylene derivatives, coumarin derivatives and combinations thereof.

13. The method of claim 10, wherein the photo-decomposition compound is selected from the group consisting of polyimide, polyamide, polyester, polyurethane, and combinations thereof.

14. The method of claim 10, wherein the alignment layer is made of rubbed alignment resin selected from the group consisting of polyimide-based resin and polyvinyl alcohol-based resin.

15. The method of claim 10, wherein the substrate is made of a polymer selected from the group consisting of polyester-based resin, acetate-based resin, polyether-based resin, polycarbonate-based resin, polyamide-based resin, polyimide-based resin, polyolefin-based resin, acrylic-based resin, polyvinyl chloride-based resin, polystyrene-based resin, polyvinyl alcohol-based resin, polyarylate-based resin, polyphenylene sulfide-based resin, polyvinylidene chloride-based resin, methacrylate-based resin, and combinations thereof.

16. The method of claim 10, wherein the substrate is made of triacetyl cellulose.

* * * * *